(12) United States Patent
Chen

(10) Patent No.: US 7,908,530 B2
(45) Date of Patent: Mar. 15, 2011

(54) MEMORY MODULE AND ON-LINE BUILD-IN SELF-TEST METHOD THEREOF FOR ENHANCING MEMORY SYSTEM RELIABILITY

(75) Inventor: Cheng-Chien Chen, Taoyuan County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 235 days.

(21) Appl. No.: 12/405,032

(22) Filed: Mar. 16, 2009

(65) Prior Publication Data

US 2010/0235691 A1 Sep. 16, 2010

(51) Int. Cl.
  *G11C 29/00* (2006.01)
  *G06F 11/00* (2006.01)
  *G06F 13/24* (2006.01)
  *G06F 12/06* (2006.01)
  *G06F 13/28* (2006.01)
  *G01R 31/28* (2006.01)

(52) U.S. Cl. .......... 714/718; 714/30; 714/723; 714/730; 714/742; 710/260; 710/261; 710/262; 710/263; 710/264; 711/5; 711/151; 711/158; 365/201

(58) Field of Classification Search .................. 714/718, 714/30, 723, 730, 742; 710/260–264; 711/5, 711/151, 158; 365/201

See application file for complete search history.

(56) References Cited

U.S. PATENT DOCUMENTS

| | | | |
|---|---|---|---|
| 5,043,874 A * | 8/1991 | Gagliardo et al. | 711/151 |
| 5,790,871 A * | 8/1998 | Qureshi et al. | 710/260 |
| 5,796,745 A * | 8/1998 | Adams et al. | 714/718 |
| 6,182,253 B1 * | 1/2001 | Lawrence et al. | 714/718 |
| 6,415,406 B1 * | 7/2002 | Kaiser et al. | 714/733 |
| 6,449,700 B2 * | 9/2002 | Hagersten et al. | 711/152 |
| 7,111,190 B2 * | 9/2006 | Venkatraman et al. | 714/6 |
| 7,428,680 B2 * | 9/2008 | Mukherjee et al. | 714/733 |
| 7,502,977 B2 * | 3/2009 | Venkatraman et al. | 714/718 |
| 7,721,175 B2 * | 5/2010 | Resnick | 714/733 |
| 2003/0093728 A1 * | 5/2003 | Sutton | 714/718 |

* cited by examiner

*Primary Examiner* — John J Tabone, Jr.
(74) *Attorney, Agent, or Firm* — Winston Hsu; Scott Margo

(57) ABSTRACT

A memory module including a plurality of memory banks, a memory control unit, and a built-in self-test (BIST) control unit is provided. The memory banks store data. The memory control unit accesses the data in accordance with a system command. The BIST control unit generates a BIST command to the memory control unit when a BIST function is enabled in the memory module. While the system command accessing the data in a specific memory bank exists, the memory command control unit has the priority to execute the system command instead of the BIST command testing the specific memory bank. Memory reliability of a system including the memory module is enhanced without reducing the system effectiveness.

18 Claims, 7 Drawing Sheets

Six commands:

| Direction | Traditional Memory Command | | | |
|---|---|---|---|---|
| | Address | Data | Precharge | Active |
| 000 Buffer→Memory bank | Address | Data | P | A |
| 001 Memory bank→Buffer | Address | Data | P | A |
| 010 Buffer→Memory BIST controller | Address | Data | P | A |
| 011 Memory BIST controller→Buffer | Address | Data | P | A |
| 100 Memory bank→Memory BIST controller | Address | Data | P | A |
| 101 Memory BIST controller→Memory bank | Address | Data | P | A |

FIG. 4

MEMORY MODULE AND ON-LINE BUILD-IN SELF-TEST METHOD THEREOF FOR ENHANCING MEMORY SYSTEM RELIABILITY

BACKGROUND OF THE INVENTION

1. Field of the Invention

The present invention relates to a memory test method, and more particularly to a build-in self-test method of a memory module for enhancing reliability of a system including the memory module without reducing the system effectiveness.

2. Description of Related Art

Today, chips are designed and manufactured for deep submicron (DSM) technology, and more memories are embedded such that memory yield has a serious effect on the yield of the entire chip. Accordingly, in order to improve the yield of chips, a repairable memory is needed.

In addition, as the degree of integration of a semiconductor device increases and the functions become more complicated, a variety of methods for efficiently testing such semiconductor devices are being developed. To guarantee the yield of products, before the products having memories are sent out of a factor, a build-in self-test method (BIST) is utilized for eliminating failure from the products. Nevertheless, good products may be damaged after being packaged, transported, and welded on print circuit board (PCB). Accordingly, the memories included in the products will be tested again on system product line with the BIST method to guarantee performance. While users get the products such as computers, BIOS (basic input output system) also tests memories in the computers with the BIST method when the users turn on the computers. Obviously, memories reliability is an important issue as known from above.

The traditional method for improving the memories reliability is simply utilized under the above conditions. As the use of electronic products prevails, such as a server continuously working for several years, or a baked mobile phone which is left in car, systems in these electronic products are easy to be down if no active method is utilized to guarantee the memories quality.

Recently, error correction code technology (ECC) is mostly used for guaranteeing memories reliability of a system in a server. However, the use of ECC technology in the system will cause efficiency loss about 5%. This is an undesirable condition for a high efficient product.

SUMMARY OF THE INVENTION

Accordingly, the present invention is directed to provide a memory module, capable of self-testing with a build-in self-test method (BIST) for enhancing reliability of a system including the memory module without reducing the system effectiveness.

The present invention provides a BIST method of a memory module for enhancing reliability of a system including the memory module without reducing the system effectiveness.

In order to solve the problems of the prior art, the present invention provides a memory module, which includes a plurality of memory banks, a memory control unit, and a built-in self-test (BIST) control unit. The memory banks store data. The memory control unit, coupled to the memory banks, accesses the data in accordance with a system command. The BIST control unit, coupled to the memory control unit, generates a BIST command to the memory control unit when a BIST function is enabled in the memory module. While the system command accessing the data in a specific memory bank exists, the memory command control unit has the priority to execute the system command instead of the BIST command testing the specific memory bank.

The present invention provides a BIST method of a memory module. The method includes accessing data in accordance with a system command from memory banks with a memory control unit; and generating a BIST command to the memory control unit when a BIST function is enabled in the memory module with a BIST control unit. While an address accessed by the system command transmitted to the memory control unit is in conflict with the address accessed by the BIST command generated from the BIST control unit, executing the system command first.

The memory module provided by the present invention can self-test with the BIST method thereof, such that memory reliability of the system including the memory module is enhanced without reducing the system effectiveness.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a command set of the memory module illustrated in FIG. 1 according to an embodiment of the present invention.

DESCRIPTION OF EMBODIMENTS

Figure 1:
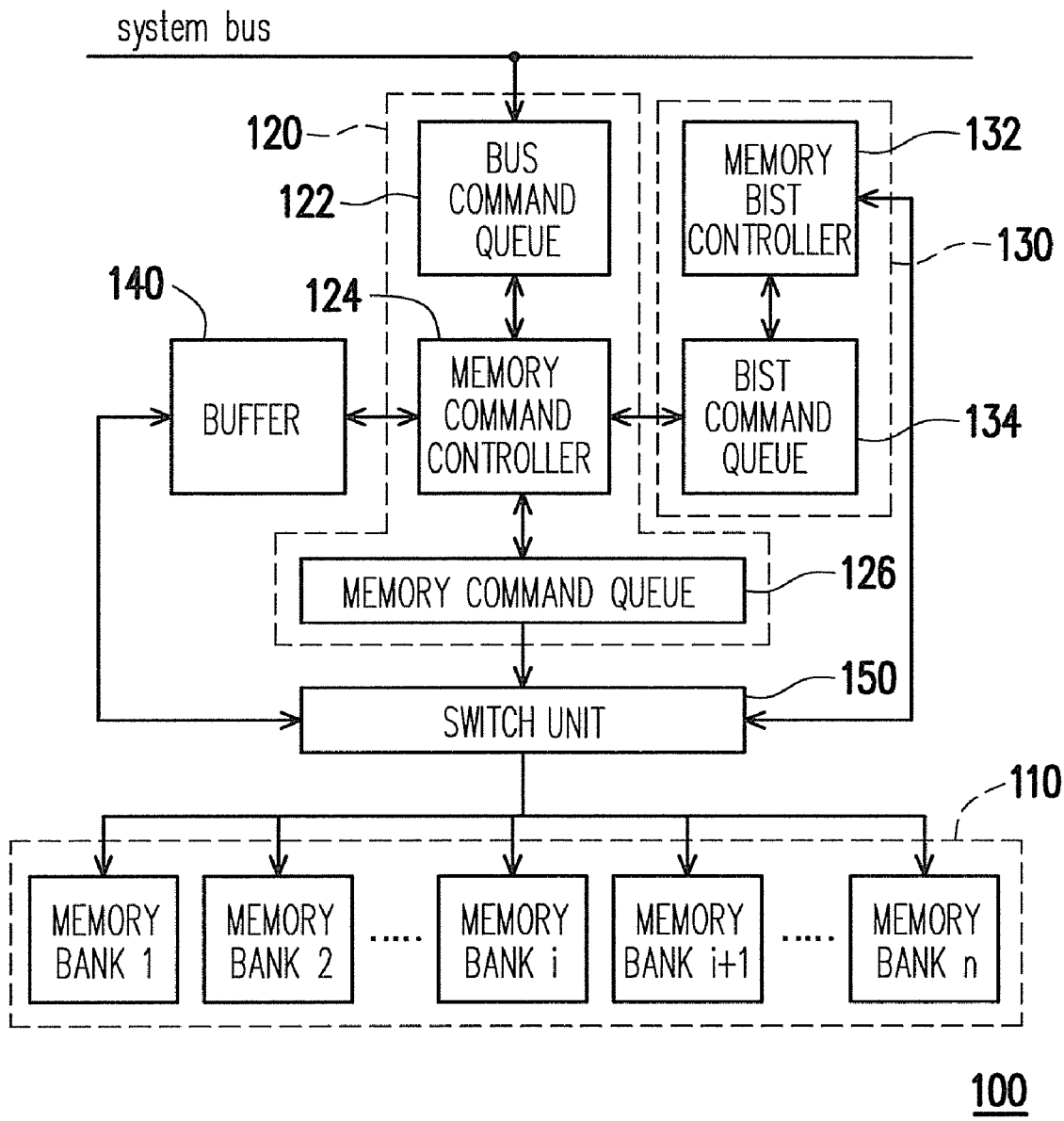
FIG. 1 is a block diagram of a memory module according to an embodiment of the present invention.

FIG. 1 is a block diagram of a memory module according to an embodiment of the present invention. Referring to FIG. 1, the memory module 100 includes a plurality of memory banks 110, a memory control unit 120, a BIST control unit 130, a buffer and a switch unit 150. In this embodiment, the memory control unit 120 comprises a bus command queue 122, a memory command controller 124 and a memory command queue 126. In addition, the BIST control unit 130 comprises a memory BIST controller 132 and a BIST command queue.

The bus command queue 122 is coupled to a system (not shown) for receiving a system command by a first-in-first-out (FIFO) rule. The memory command controller 124 receives the system command from the bus command queue 122, and then generates a memory command to satisfy the system requirements, such as accessing data stored in the memory banks 110, which the system needs, in accordance with the system command. Additionally, the memory command queue 126 is coupled to the memory command controller 124 and the memory banks 110 for receiving the memory command from the memory command controller 124, and then outputting the memory command to the memory banks 110 by the FIFO rule.

Figure 2:
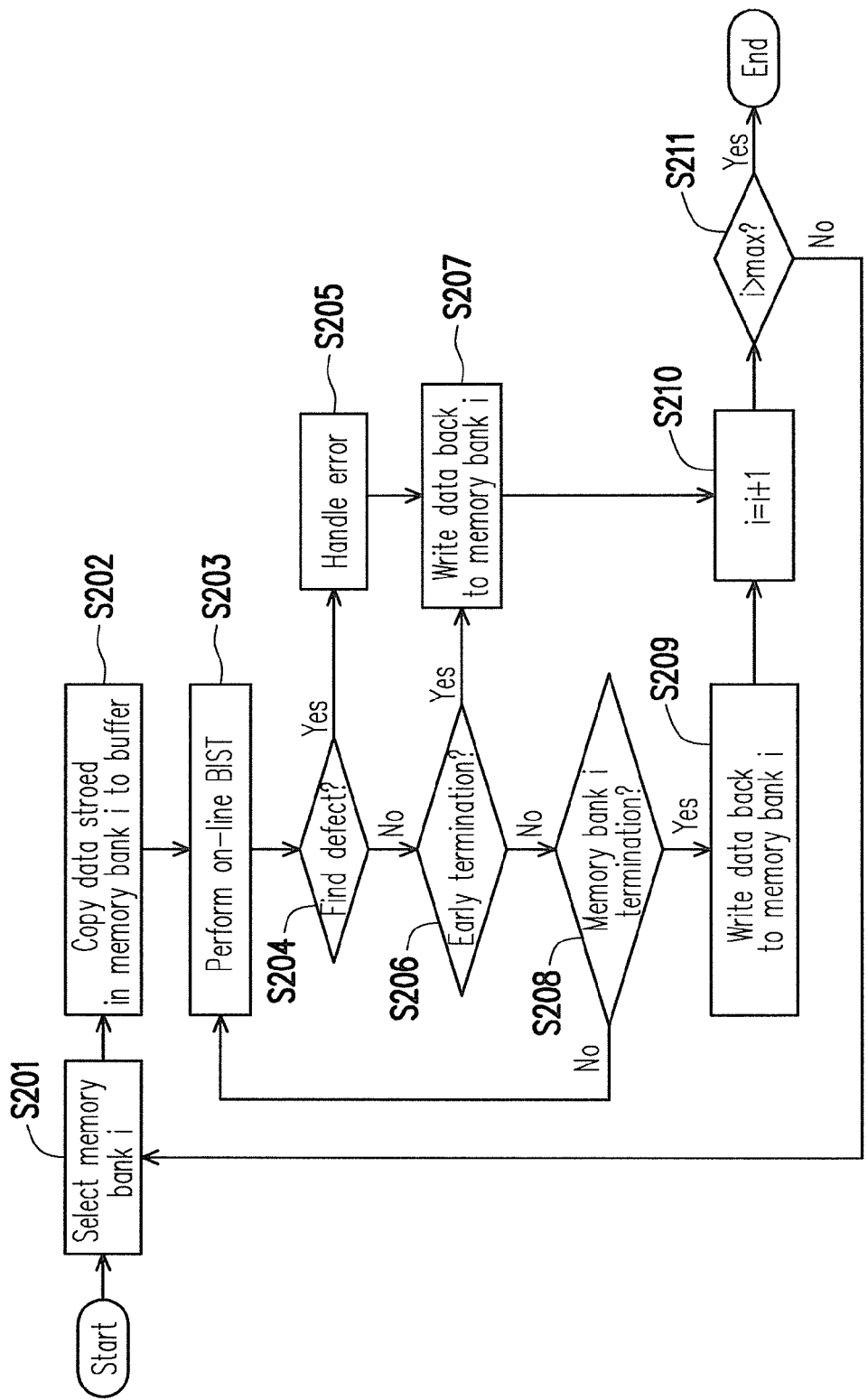
FIG. 2 is a flow chart of a BIST method of the memory module illustrated in FIG. 1.
Figure 3:
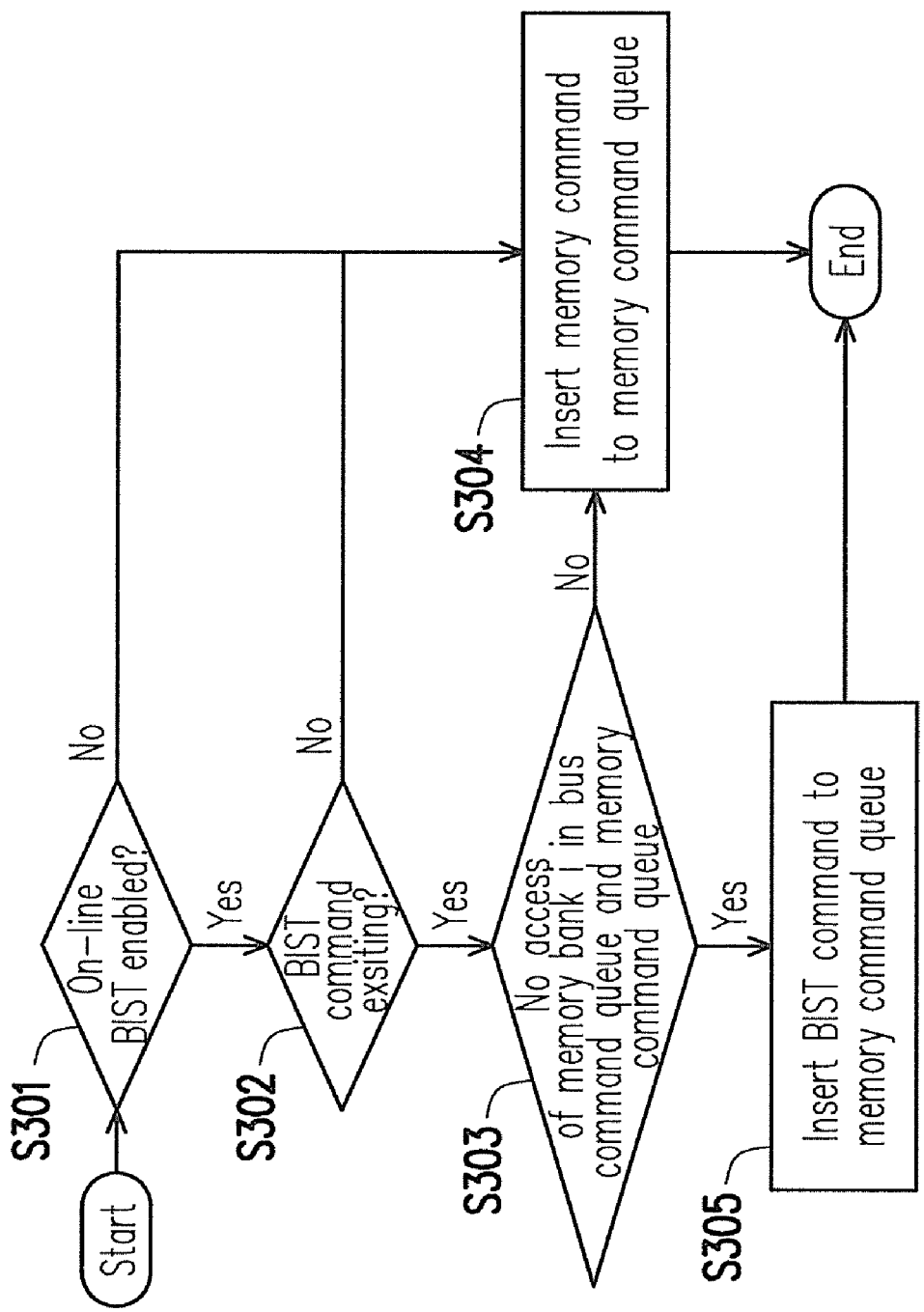
FIG. 3 is a flow chart of an on-line BIST about priority of commands.

FIG. 2 is a flow chart of a BIST method of the memory module illustrated in FIG. 1. The BIST method of the memory module 100 can be utilized under some conditions. For example, while the system is power-on or on-line, or when ECC detects or corrects error, the BIST method is suitable for the system. FIG. 3 is a flow chart of a on-line BIST about priority of commands. With reference to FIGS. 1-3, while the on-line BIST is enable, the memory BIST controller 132 first selects a memory bank i from the memory banks 110 (step S201), which is going to be performed the BIST, wherein $1 \leq i \leq n$. Meanwhile, the memory BIST controller 132 generates a BIST command to the BIST command queue. The data stored in the memory bank i is copied to the buffer 140 before the BIST is performed (step S202). When the BIST is performed (step S203), the memory BIST controller 132 loads a BIST pattern to the memory bank i for finding defects (step S204). If the defects exist in the memory bank i, the memory BIST controller 132 handles error (step S205), such as triggering a repair circuit, remapping the defect area, marking the defect area or reporting the error. If no defect exists in the memory bank i, the BIST can be optionally terminated (step S206), and thus the data copied to the buffer 140 is written back to the memory bank i (step S207). In contrast, the BIST can also be continuously performed until the BIST testing the memory bank i is completely finished (step S208), and then the data is written back to the memory bank i (step S209), or the BIST will still be performed (step 203). After the BIST testing the memory bank i has been completely finished, and the data has also been written back to the memory bank i, the memory BIST controller 132 selects a memory bank p from the memory banks 110. For example, after the memory BIST controller 132 modifies the memory bank index from i to i+1 (step S210), and checks whether the number i is larger than the number n, the memory bank p is determined (step S211). After that, if i≦n, the process proceeds to the next, and the memory BIST controller 132 begins to perform the BIST operation again, so as to repeatedly perform the same activity. That is, the steps illustrated in FIG. 2 return to the step S201, but the memory BIST controller 132 selects a memory bank i+1. On the other hand, if i>n, the BIST operation will be stopped.

Note that the priority of the BIST command and the memory command related to be inserted to the memory command queue 126 is worth attention. In this embodiment, besides maintaining a operation of inserting the memory command to the memory command queue 126, the memory command controller 124 still follows the flow illustrated in FIG. 3 to judge when to insert the BIST command to the memory command queue 126. In normal operation, if the on-line BIST is disenabled (step S301), or the on-line BIST is enabled, but no BIST command exists in the BIST command queue 134 (step S302), the memory command controller 124 inserts the memory command to the memory command queue 126 (step S304). In contrast, while the on-line BIST is enabled (step S301), and the BIST command testing the memory bank i exists in the BIST command queue 134 (step S302), the flow will go to a step S303. In the bus command queue 122 and the memory command queue 126, if any memory command accessing the data in the memory bank i exists, the memory command controller 124 has the priority to insert the memory command to the memory command queue 126 (step S304) instead of the BIST command testing the memory bank i (step S305). Accordingly, while no access of the memory bank i is in the bus command queue 122 and the memory command queue 126, the memory command controller 124 just inserts the BIST command testing the memory bank i to the memory command queue 126 (step S305).

Besides, in order to perform the BIST operation, the data of the memory bank i, which is going to be tested, is needed to copy to the buffer 140. For this reason, if the data, which is going to be accessed by the memory command controller 124, has already been copied to the buffer 240, the memory command controller 124 accesses the data from the buffer 240 directly. On the other hand, if the data is still in the memory bank i, the memory command controller 124 will insert the memory command to the memory command queue 126 for accessing the data of the memory bank i as the same before. In some condition, the memory command is performed after the BIST command has been done. That is, while the data, which is going to be accessed by the memory command controller 124, is dealt with the BIST command, the memory command has to wait for the termination of the BIST command to judge where to access the data (i.e. accessing the data from the buffer or the memory bank i). It is to be understood that this happening is accidental, and will not have a great effect upon the system effectiveness.

FIG. 4 is a command set of the memory module illustrated in FIG. 1 according to an embodiment of the present invention. Referring to FIG. 4, there are six commands outputting from the memory BIST controller 132. In the embodiment, new columns "Direction" are respectively added to traditional memory commands to form the six new commands with different functions. A first direction 000 means the data in the buffer 140 is restored to the memory bank i, and a second direction 001 means the data of the memory bank i is copied to the buffer 140. A third direction 010 and a fourth direction 011 are in connection with an integrity test to the buffer 140. That is, the buffer 140 can also be tested with the BIST method mentioned above by the memory BIST controller 132, and the commands with the third direction 010 and the fourth direction 011 are needed. Similarly, while the memory banks 110 are tested by the memory BIST controller 132, commands with a fifth direction 100 and the sixth direction 101 are needed. It should be noted that these commands can be transmitted between the memory banks 110, the memory BIST controller 132 and the buffer 140 through the switch unit 150 to enhance the memory module 100 effectiveness.

Figure 5:
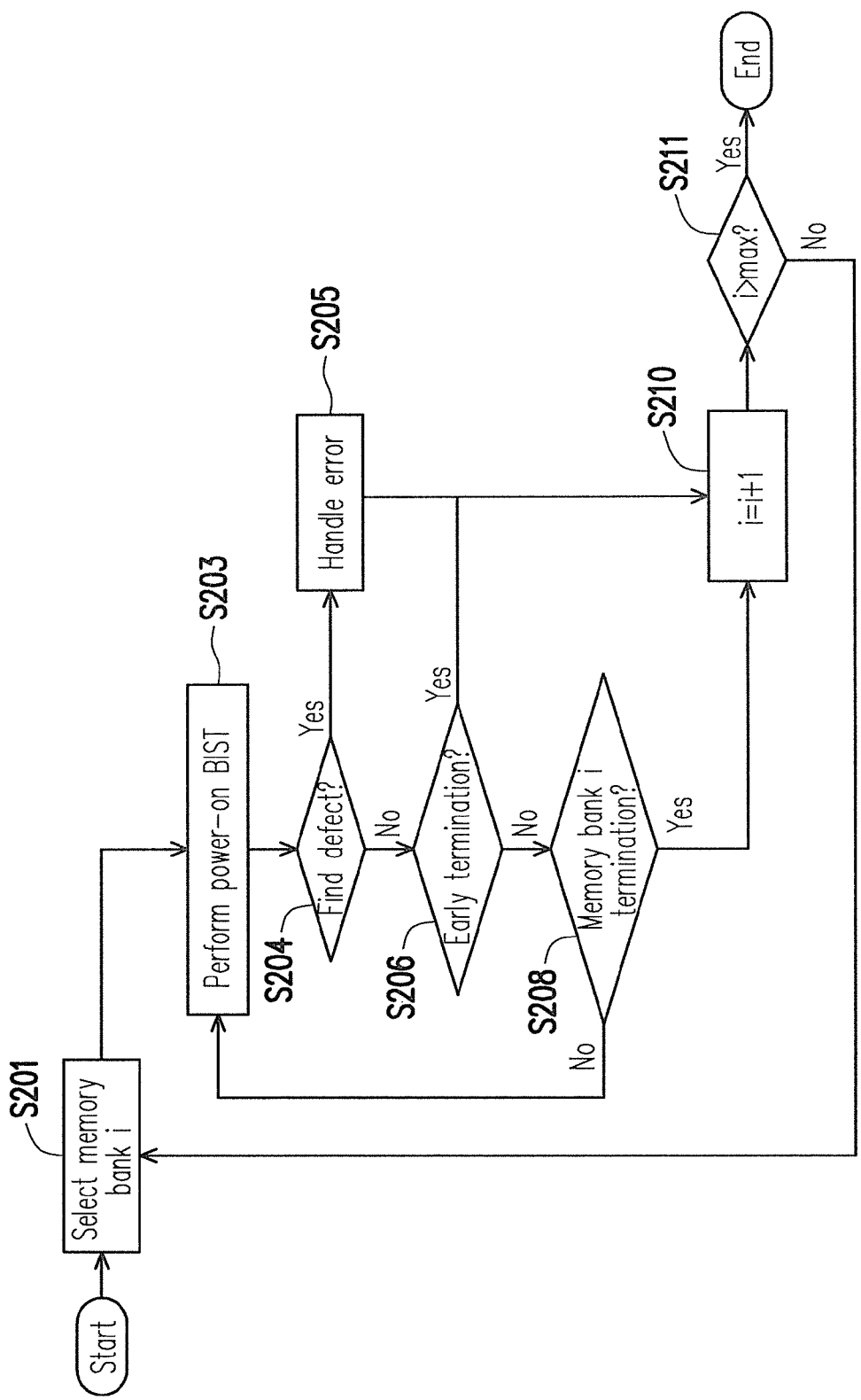
FIG. 5 is a flow chart of a power-on BIST of the memory module illustrated in FIG. 1 according to an embodiment of the present invention.

FIG. 5 is a flow chart of a power-on BIST of the memory module illustrated in FIG. 1 according to an embodiment of the present invention. With reference to FIG. 5, the power-on BIST of the present embodiment is similar to the on-line BIST illustrated in FIG. 2 except that the power-on BIST can work without backuping the data from the memory banks 110 in the flow. In the embodiment, the power-on BIST can work without copying the data stored in the memory bank i to the buffer 140 before the BIST is performed and write the data back to the memory bank i because the data is inconsequential while the system is power-on. As the foregoing description, the power-on BIST performs a similar activity to the on-line BIST, so that the detail is not iterated.

Figure 6:
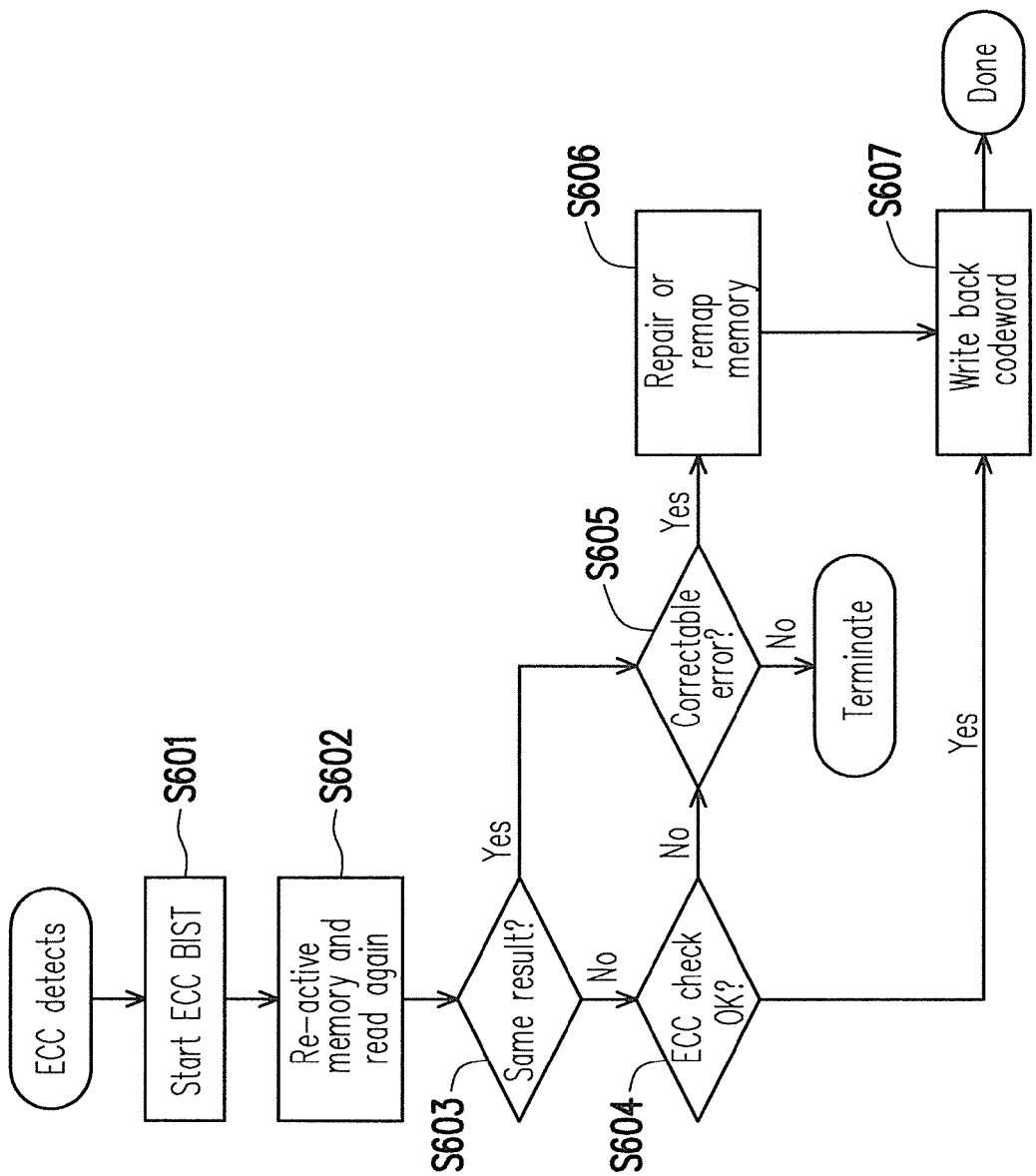
FIG. 6 is a flow chart while the ECC detects errors in the memory banks.
Figure 7:
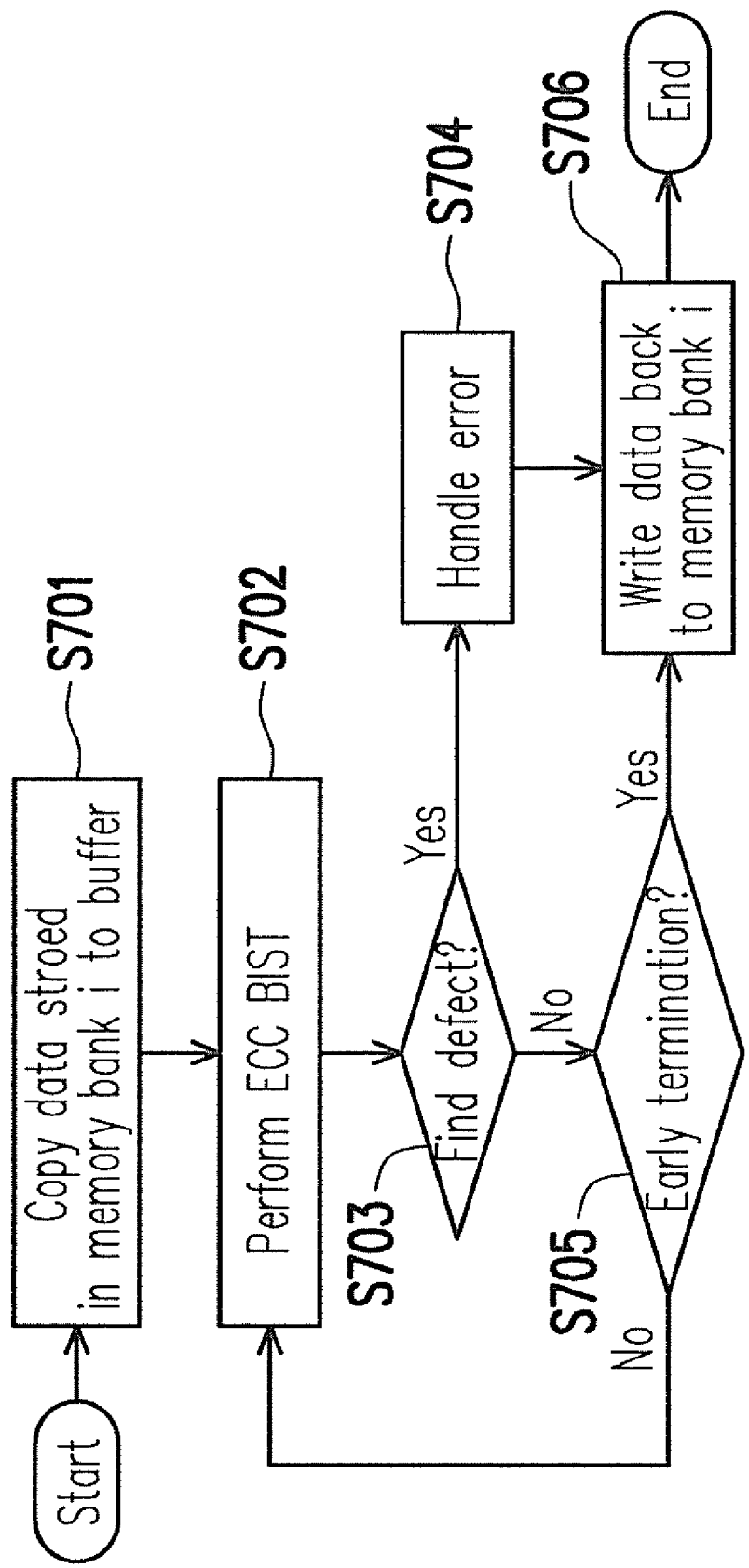
FIG. 7 is a flow chart of an ECC BIST of the memory module illustrated in FIG. 1 according to an embodiment of the present invention.

FIG. 6 is a flow chart while an ECC circuit detects errors in the memory banks. FIG. 7 is a flow chart of an ECC BIST of the memory module illustrated in FIG. 1 according to an embodiment of the present invention. With reference to FIG. 6 and FIG. 7, while the ECC circuit (not shown) detects error in the memory bank i, for example, the memory BIST controller 132 of the memory module 100 will start the ECC BIST illustrated in FIG. 7 (step S601). As the ECC BIST starts, the data stored in the memory bank i is first copied to the buffer 140 before the ECC BIST is performed (step S701). When the ECC BIST is performed (step S702), the memory BIST controller 132 loads a BIST pattern to the memory bank i for finding defects (step S703). If the defects exist in the memory bank i, the memory BIST controller 132 handles error (step S704). If no defect exists in the memory bank i, the ECC BIST can be optionally terminated (step S705), and then the data copied to the buffer 140 is written back to the memory bank i (step S706), or the flow returns to the step S702, and thus the ECC BIST continues to perform repeatedly. After the ECC BIST is end, the ECC circuit re-actives, or refreshes or pre-charges, the memory bank i, and reads the data again (step S602) to check whether a result is the same as the previous result (step S603). If the result is the same as before, and the error is correctable (step S605), the correctable error will be repaired or a memory remap function will be triggered (step S606). Then, a codeword is written back (step S607), and the flow has been done. If the error is not correctable (step S605), the flow will be terminated. Besides, if the result is different from the previous result (step S603), the ECC circuit checks the memory bank i again (step S604). While the result checked is no error, the codeword is written back (step S607), and the flow has been done.

In other embodiment, the described step S701 can only copy a word, which is an error detected by the ECC circuit. While the step S701 only copies the error word, the step S705 is skipped. That is, the ECC BIST finds no defect in the memory bank i, and then writes the word copied to the buffer 140 back to an address of the word in the memory bank i (step S706).

In the present invention, in addition to the memory module, the BIST method of the memory module is further provided. For the method, enough teaching, suggestion, and implementation illustration are obtained from the above embodiments, so it is not described.

To sum up, the BIST method of the memory module can be utilized under some conditions such as the system is power-on or on-line, or when ECC circuit detects or corrects error, the BIST method is suitable for the system. As a result, memory reliability of the system including the memory module is enhanced without reducing the system effectiveness and without additional hardware cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory module, comprising:
a plurality of memory banks, for storing data;
a memory control unit, coupled to the memory banks, for accessing the data in accordance with a system command; and
a built-in self-test (BIST) control unit, coupled to the memory control unit, for generating a BIST command to the memory control unit when a BIST function is enabled in the memory module;
wherein if the system command accessing the data in a specific memory bank exists, the memory command control unit has the priority to execute the system command instead of the BIST command testing the specific memory bank.

2. The memory module as claimed in claim 1, wherein the BIST control unit comprising:
a memory BIST controller, coupled to the memory banks, for generating the BIST command while the BIST function is enabled; and
a BIST command queue, coupled between the memory control unit and the memory BIST controller, for registering the BIST command outputted from the memory BIST controller, wherein the memory control unit receives the BIST command from the BIST command queue by a first-in-first-out (FIFO) rule.

3. The memory module as claimed in claim 1, wherein the memory control unit comprising:
a bus command queue, coupled to a system, for receiving the system command by the FIFO rule;
a memory command controller, coupled to the bus command queue and the BIST control unit, for receiving the system command from the bus command queue and generating a memory command to satisfy system requirements, and also receiving the BIST command from the BIST control unit to perform the BIST function with the memory banks; and
a memory command queue, coupled to the memory command controller and the memory banks, for receiving the memory command and/or the BIST command and outputting the memory command and/or the BIST command to the memory banks by the FIFO rule.

4. The memory module as claimed in claim 1, further comprising a buffer, coupled to the memory control unit, for storing the data copied from a first memory bank of the memory banks.

5. The memory module as claimed in claim 4, wherein before the first memory bank is performed with the BIST function, the data stored in the first memory bank is copied to the buffer.

6. The memory module as claimed in claim 4, further comprising a switch unit, coupled to the memory control unit, the memory banks, the BIST control unit and the buffer.

7. The memory module as claimed in claim 5, wherein after the first memory bank is performed with the BIST function, the memory command controller accesses the data copied from the first memory bank from the buffer.

8. The memory module as claimed in claim 5, wherein after the first memory bank is performed with the BIST function, the data stored in the buffer is written back to the first memory bank from the buffer.

9. The memory module as claimed in claim 1, wherein while the first memory bank is performed with the BIST function, the memory control unit accesses the data from a second memory bank of the memory banks.

10. The memory module as claimed in claim 1, wherein while the first memory bank is performed with the BIST function, the memory control unit does not access the data from the first memory bank.

11. A built-in self-test (BIST) method of a memory module, comprising:
accessing data in accordance with a system command from memory banks with a memory control unit; and
generating a BIST command to the memory control unit when a BIST function is enabled in the memory module with a BIST control unit;
wherein if the system command accessing the data in a specific memory bank exists, the memory command control unit has the priority to execute the system command instead of the BIST command testing the specific memory bank.

12. The BIST method as claimed in claim 11, further comprising:

generating the BIST command from a memory BIST controller while the BIST function is enabled; and registering the BIST command outputted from the memory BIST controller in a BIST command queue, wherein receiving the BIST command from the BIST command queue with the memory control unit by a first-in-first-out (FIFO) rule.

13. The BIST method as claimed in claim 12, further comprising:

receiving the system command with a bus command queue in the memory control unit by the FIFO rule;

transmitting the system command from the bus command queue;

generating a memory command to a memory command controller to satisfy system requirements;

transmitting the BIST command from the BIST control unit to the memory command controller;

receiving the memory command and/or the BIST command with a memory command queue; and outputting the memory command and/or the BIST command from the memory command queue to the memory banks by the FIFO rule.

14. The BIST method as claimed in claim 11, further comprising copying the data from a first memory bank of the memory banks to a buffer.

15. The BIST method as claimed in claim 14, wherein before testing the first memory bank with the memory BIST controller, copying the data from the first memory bank to the buffer.

16. The BIST method as claimed in claim 15, wherein after testing the first memory bank with the memory BIST controller, accessing the data copied from the first memory bank from the buffer to the memory command controller.

17. The BIST method as claimed in claim 15, wherein after testing the first memory bank with the memory BIST controller, writing the data stored in the buffer back to the first memory bank from the buffer.

18. The BIST method as claimed in claim 11, wherein while testing the first memory bank with the memory BIST controller, accessing the data from a second memory bank of the memory banks to the memory control unit.

* * * * *